(12) United States Patent
Hu et al.

(10) Patent No.: US 11,495,379 B2
(45) Date of Patent: Nov. 8, 2022

(54) MANUFACTURING METHOD OF AN INTEGRATED DRIVING MODULE WITH ENERGY CONVERSION FUNCTION

(71) Applicant: Phoenix & Corporation, Grand Cayman (KY)

(72) Inventors: Wen-Hung Hu, Hsinchu County (TW); Tsung-Yueh Chen, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 378 days.

(21) Appl. No.: 16/878,682

(22) Filed: May 20, 2020

(65) Prior Publication Data
US 2020/0279683 A1 Sep. 3, 2020

Related U.S. Application Data

(62) Division of application No. 16/548,919, filed on Aug. 23, 2019, now Pat. No. 10,707,000.

(30) Foreign Application Priority Data

Aug. 31, 2018 (TW) .................................. 107130521

(51) Int. Cl.
*H05K 1/18* (2006.01)
*H01F 7/06* (2006.01)
(Continued)

(52) U.S. Cl.
CPC ............ *H01F 7/06* (2013.01); *H01F 41/041* (2013.01); *H01L 21/4857* (2013.01);
(Continued)

(58) Field of Classification Search
CPC .. H05K 1/165; H05K 1/185–187; H05K 3/00; H05K 3/30; H05K 3/0044; H05K 3/4644; H01F 41/041
(Continued)

(56) References Cited

U.S. PATENT DOCUMENTS 6,800,936 B2 * 10/2004 Kosemura ............... H01L 23/66
361/761
2010/0177070 A1 7/2010 Zhu et al.
(Continued)

*Primary Examiner* — Tuan T Dinh
(74) *Attorney, Agent, or Firm* — McClure, Qualey & Rodack, LLP

(57) ABSTRACT

A manufacturing method of an integrated driving module with energy conversion function includes providing a carrier board and forming an integrated electromagnetic induction component layer having a first dielectric layer, a plurality of conductive coil layers and a plurality of conductive connecting components on a surface of the carrier board. A patterned conductive circuit layer is formed on the integrated electromagnetic induction component layer, and electrically connecting to each other through the conductive connecting components. An embedded electrical component is patterned on the patterned conductive circuit layer. A conductive component is disposed on the patterned conductive circuit layer. Thereafter, the method forms a second dielectric layer to cover the embedded electrical component and the conductive component and removes the carrier board to form a plurality of integrated driving modules.

6 Claims, 5 Drawing Sheets

(51) Int. Cl.
*H01F 41/04* (2006.01)
*H05K 1/16* (2006.01)
*H01L 23/498* (2006.01)
*H05K 3/30* (2006.01)
*H05K 3/00* (2006.01)
*H01L 21/48* (2006.01)
*H05K 3/46* (2006.01)
*H01L 33/58* (2010.01)

(52) U.S. Cl.
CPC .. *H01L 23/49822* (2013.01); *H01L 23/49838* (2013.01); *H01L 33/58* (2013.01); *H05K 1/165* (2013.01); *H05K 1/187* (2013.01); *H05K 3/0044* (2013.01); *H05K 3/30* (2013.01); *H05K 3/4644* (2013.01); *H01F 2007/068* (2013.01); *H05K 2201/10151* (2013.01); *H05K 2203/166* (2013.01)

(58) Field of Classification Search
USPC .............. 361/764–766, 782, 784, 790–795, 361/760–763; 336/149–151; 29/602–608, 830–852
See application file for complete search history.

(56) References Cited

U.S. PATENT DOCUMENTS

| | | | | |
|---|---|---|---|---|
| 2011/0248380 | A1* | 10/2011 | Yoshihara | H05K 1/165 257/E29.325 |
| 2012/0287589 | A1* | 11/2012 | Watanabe | H03H 9/0566 361/783 |
| 2014/0036464 | A1* | 2/2014 | Kilger | H01L 24/20 361/767 |
| 2014/0118976 | A1* | 5/2014 | Yoshikawa | H01L 23/5384 361/761 |
| 2014/0133117 | A1 | 5/2014 | Saji et al. | |
| 2015/0189797 | A1* | 7/2015 | Oster | B81B 7/0032 156/247 |
| 2015/0302974 | A1* | 10/2015 | Zhao | H01F 41/046 336/200 |
| 2016/0150649 | A1* | 5/2016 | Peng | H01L 23/49827 438/126 |

\* cited by examiner

MANUFACTURING METHOD OF AN INTEGRATED DRIVING MODULE WITH ENERGY CONVERSION FUNCTION

CROSS REFERENCE TO RELATED APPLICATIONS

This application is a divisional application of U.S. application Ser. No. 16/548,919, filed Aug. 23, 2019, which claims priority under 35 U.S.C. § 119(a) on Patent Application No. 107130521 filed in Republic of China on Aug. 31, 2018, the entire contents of which are hereby incorporated by reference.

BACKGROUND

1. Technical Field

The present invention generally relates to a driving module and its manufacturing method, and more particularly, to an integrated driving module with energy conversion function and its manufacturing method.

2. Description of Related Art

With the popularity of social network sites and the stronger camera function of intelligent mobile phone, people increasingly rely on the use of intelligent mobile phone camera to take photos and videos, and more and more technologies used by traditional camera and video recorder are imported to mobile phone camera. In order to overcome the problems of night shot and hand shaking caused fuzzy condition, the higher-order phone with built-in image stabilization function is more and more common.

One of the technologies used in image stabilization is the optical image stabilization (OIS), which uses the lens-shift optical image stabilization or senor-shift optical image stabilization to reverse the motion of the camera as it moves horizontally or up and down. The optical image stabilization has the advantage of high reliability without loss the resolution of the image. The effect is better than the electronic image stabilization, but the disadvantage is that it is relatively expensive in the cost. The lens body cannot be made very thin and the edge resolution decreases.

The above optical image stabilization function is realized by a magnetic driving device, which is disposed between a lens module and an image sensing component. Please refer to FIG. 1A and FIG. 1B, to illustrate a conventional magnetic driving device 10. FIG. 1A shows the section view of magnetic driving device 10, while FIG. 1B shows the explosive view of magnetic driving device 10 of FIG. 1A.

The magnetic driving device 10 includes a support frame 11, a flexible circuit board 12, a first adhesion layer 13, a Hall sensor 14, a flexible coil plate 15, a second adhesion layer 16 and a conductive connecting component 17. The flexible circuit board 12 consists of the soft insulating layer 121 and circuit layer 122. The flexible circuit board 12 is fixed on the support frame 11 through the first adhesion layer 13. Since the flexible circuit board 12 is flexible, its two sides could fold down and fix on the side 111 of support frame 11. Hall sensor 14 is electrically connected to the welding pad of circuit layer 122 of flexible circuit board 12 through the conductive connecting component 17. Wherein the conductive connecting component 17 is the soldering tin. The flexible coil plate 15 has a plurality of coils 151. The flexible coil plate 15 is fixed to the insulating layer 121 of the flexible circuit board 12 through the second adhesion layer 16, and the flexible coil plate 15 is electrically connected to the welding pad 152 of the circuit layer 122 of the flexible circuit board 12 through the conductive connecting component 17.

According to the above mentioned, the conventional magnetic driving device 10 is composed of a plurality of components, at least including a support frame 11, a flexible circuit board 12, a hall sensor 14 and a flexible coil plate 15. Each component is produced by independent manufacturer and finally assembled by assembly plant. The magnetic driving devices obtained by this method have at least the following disadvantages: (1) the components are produced by different manufacturers, which means the size and thickness of each component are limited and cannot be reduced effectively, resulting in the overall thickness reaching 800 um (microns); (2) the number of components is large, and the assembly must be manually operated, so the product precision is relatively low, and the yield will be affected; (3) assuming the above two points, it will be difficult to reduce the cost.

SUMMARY OF THE INVENTION

It is therefore an object of the present invention to provide an integrated driving module with energy conversion function and its manufacturing method, which integrates the semiconductor manufacturing process and make the driving module integrated, thereby reducing the overall size and thickness.

Another purpose of the present invention is to provide an integrated driving module with energy conversion function and its manufacturing method, which can improve the overall combination accuracy and improve the yield rate of production.

To achieve the above, the present invention is to provide an integrated driving module with energy conversion function, which includes a patterned conductive circuit layer, an integrated electromagnetic induction component layer, a second dielectric layer, an embedded electrical component and a conductive component. The patterned conductive circuit layer has a relatively arranged first surface and second surface. The integrated electromagnetic induction component layer is arranged on the first surface of the patterned conductive circuit layer. In addition, the integrated electromagnetic induction component layer also includes a plurality of conductive coil layers, a plurality of conductive connecting components and a first dielectric layer. Such conductive coil layers stack with each other. The conductive connecting components are electrically connected to each conductive coil layer and between the corresponding conductive coil layer and the patterned conductive circuit layer respectively. The first dielectric layer covers the conductive coil layer and the conductive connecting component. The second dielectric layer is formed on the second surface of the patterned conductive circuit layer and covers the patterned conductive circuit layer. The embedded electrical component is arranged in the second dielectric layer and electrically connected with the second surface of the patterned conductive circuit layer. The conductive component is arranged in the second dielectric layer, one end of which is electrically connected with the second surface of the patterned conductive circuit layer, and the other end face of which is exposed to the second dielectric layer.

In one embodiment of the present invention, wherein the conductive component can be the conductive pillar. In addition, the conductive connecting components could also be the conductive pillar respectively.

In one embodiment of the present invention, wherein the embedded electrical component is the hall sensing component. In addition, the embedded electrical component could also be the semiconductor package component, or the die.

In one embodiment of the present invention, wherein the integrated electromagnetic induction component layer forms a plate coil.

In one embodiment of the present invention, wherein the material of the first dielectric layer and the second dielectric layer is the molding compound.

In one embodiment of the present invention, wherein the integrated driving module is disposed in an image-capturing module or a motor control module.

Additionally, to achieve the above, the present invention is to provide a manufacturing method of an integrated driving module with energy conversion function, which includes the following steps. Step 1 is to provide a carrier board. Step 2 is to form an integrated electromagnetic induction component layer having a first dielectric layer, a plurality of conductive coil layers and a plurality of conductive connecting components on the surface of the carrier board. Step 3 is to form a patterned conductive circuit layer on the integrated electromagnetic induction component layer, and electrically connects to each other through the conductive connecting components. Step 4 is to dispose an embedded electrical component on the patterned conductive circuit layer. Step 5 is to dispose a conductive component on the patterned conductive circuit layer. Step 6 is to form a second dielectric layer to cover the embedded electrical component and the conductive component, to selectively grind the surface above the second dielectric layer to expose one end face of the conductive component. Step 7 is to remove the carrier board to form a plurality of integrated driving modules.

In one embodiment of the present invention, wherein the step for forming the integrated electromagnetic induction component layer also includes the following sub-steps. Sub-step 1 is to form a first sub-dielectric layer on the surface of the carrier board. Sub-step 2 is to form a first conductive coil layer on a surface of the first sub-dielectric layer. Sub-step 3 is to form a second sub-dielectric layer covering the first conductive coil layer and the first sub-dielectric layer, and exposing a part of the first conductive coil layer. Sub-step 4 is to form a first conductive connecting component on the exposed first conductive coil layer. Sub-step 5 is to form a second conductive coil layer on the second sub-dielectric layer and the first conductive connecting component. Sub-step 6 is to form a third sub-dielectric layer covering the second sub-dielectric layer and the second conductive coil layer. Sub-step 7 is to selectively repeat the above steps.

In one embodiment of the present invention, the manufacturing method further includes selectively grinding the upper surface of the second dielectric layer, to expose an end face of the conductive component.

In one embodiment of the present invention, wherein the integrated driving module manufacturing method further includes forming at least one opening, to expose a part of the patterned conductive circuit layer.

In one embodiment of the present invention, wherein the integrated driving module manufacturing method further includes cutting the integrated driving module, to form the individual integrated driving module.

In one embodiment of the present invention, wherein the carrier board has at least one alignment marker, and before implementing each processing step further includes aligning according to the alignment marker.

In summary, according to the integrated driving module with energy conversion function and its manufacturing method of the present invention, except for the embedded electrical component, the rest is formed by semiconductor manufacturing process, including the integrated electromagnetic induction component layer, the patterned conductive circuit layer and the conductive components, etc. Therefore, the manual assembly process can be reduced, and the production yield can be improved. Moreover, the driving module can be formed as a whole, thus reducing the overall size and thickness. In addition, the product precision can be effectively improved by the semiconductor manufacturing process.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DETAILED DESCRIPTION

Reference will now be made to the drawings to describe various inventive embodiments of the present disclosure in detail, wherein like numerals refer to like elements throughout.

Figure 1A:
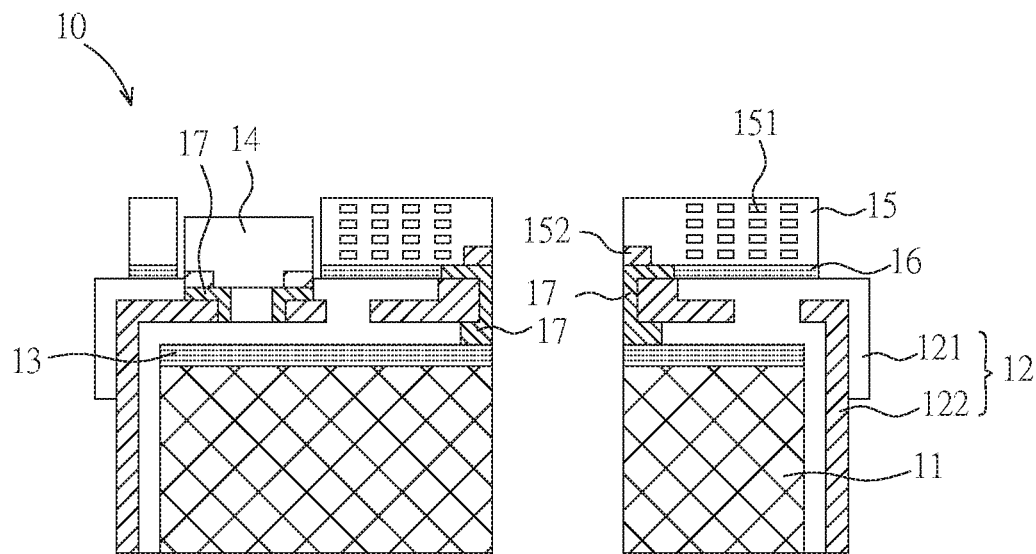
FIG. 1A is a schematic cross-sectional view showing a conventional magnetic driving device.
Figure 1B:
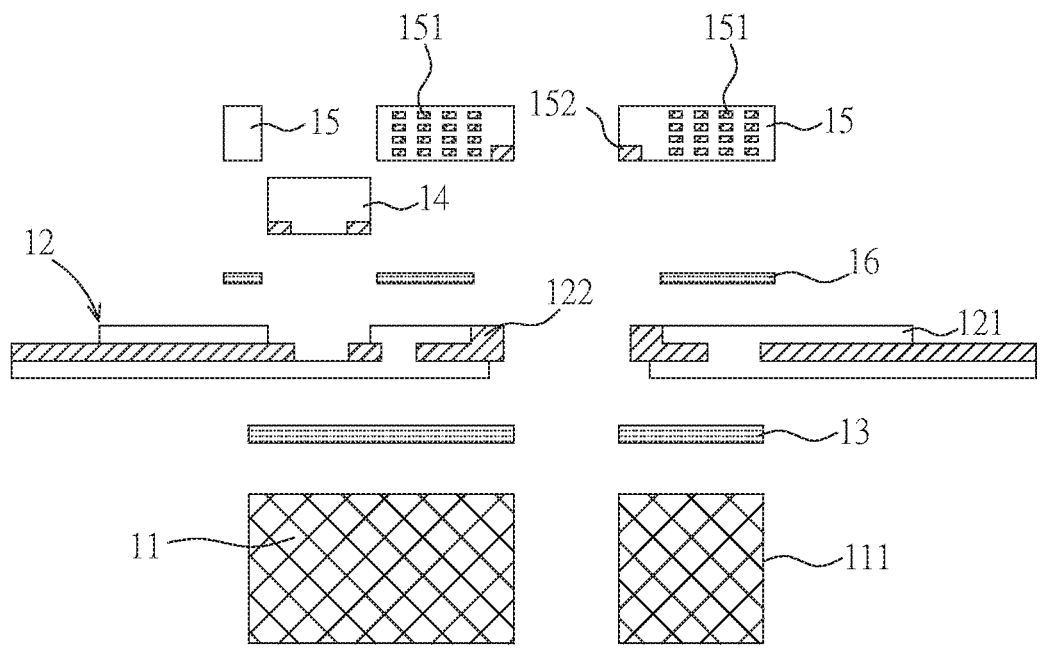
FIG. 1B is a schematic diagram showing the explosion of the magnetic driving device of FIG. 1A.
Figure 2:
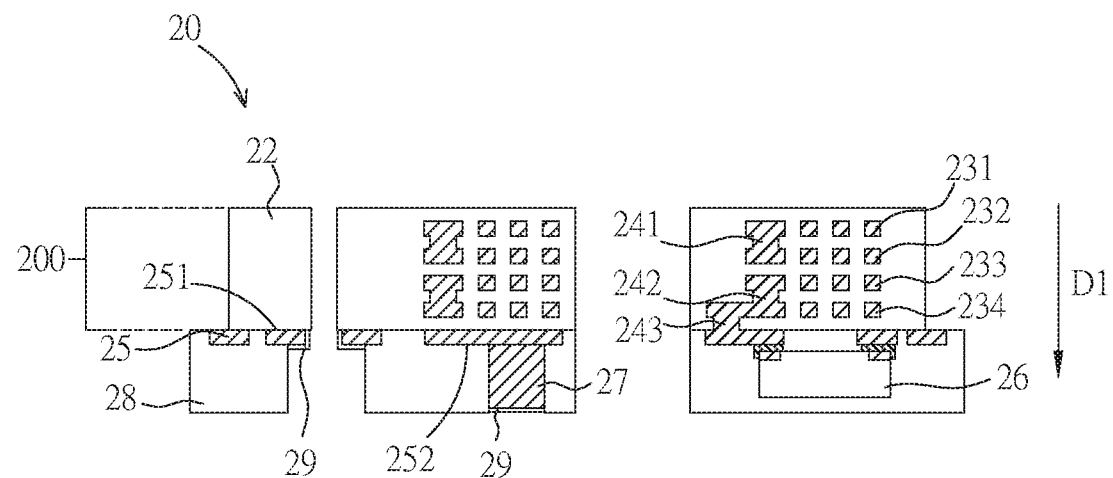
FIG. 2 is a schematic cross-sectional view showing an integrated driving module with an energy conversion function according to a preferred embodiment of the present invention.

As shown in FIG. 2, an integrated driving module 20 with energy conversion function according to one of the preferred embodiments of the present invention includes a patterned conductive circuit layer 25, an integrated electromagnetic induction component layer 200, a second dielectric layer 28, an embedded electrical component 26, and a conductive component 27. In this embodiment, the integrated driving module 20 is a driving module for converting the electrical energy into magnetic energy, which can be used in such fields as image-capturing module or motor control module.

Furthermore, when the integrated driving module 20 is applied to the image-capturing module, it can be used as optical image stabilization. The magnetic force controls the action of the magnetite connected to the lens to maintain the stability of the lens. In addition, when the integrated driving module 20 is applied to the motor control, it can be used as the stator of the motor to control the rotor motion connected with the stator by magnetic force.

The patterned conductive circuit layer 25 has a relatively arranged first surface 251 and second surface 252. The material of the patterned conductive circuit layer 25 is the metal, such as gold, silver, copper, platinum, nickel, palladium, cobalt, or an alloy thereof. Part of the patterned conductive circuit layer 25 is used as the conductive circuit, and part of the patterned conductive circuit layer 25 is used as the electrical pad.

The integrated electromagnetic induction component layer 200 is disposed and electrically connected to the first surface 251 of the patterned conductive circuit layer 25. In this embodiment, the integrated electromagnetic induction component layer 200 includes a first dielectric layer 22, a first conductive coil layer 231, a second conductive coil layer 232, a third conductive coil layer 233, a fourth conductive coil layer 234, a first conductive connecting component 241, a second conductive connecting component 242 and a third conductive connecting component 243.

The first conductive coil layer 231, the second conductive coil layer 232, the third conductive coil layer 233 and the fourth conductive coil layer 234 are stacked corresponding to a projection direction D1, and embedded in the first dielectric layer 22. The first conductive connecting component 241, the second conductive connecting component 242 and the third conductive connecting component 243 are also embedded in the first dielectric layer 22, and the first conductive connecting component 241 is electrically connected between the first conductive coil layer 231 and the second conductive coil layer 232, while the second conductive connecting component 242 is electrically connected between the third conductive coil layer 233 and the fourth conductive coil layer 234, and the third conductive connecting component 243 is electrically connected between the fourth conductive coil layer 234 and the patterned conductive circuit layer 25.

It should be noted that according to the required electromagnetic induction effect, the number of layers and connection relationship of conductive coil layer and conductive connecting component can be changed in the design accordingly to meet the actual requirements. In addition, since this embodiment shows in a section view, there may be another conductive connecting component between the second conductive coil layer 232 and the third conductive coil layer 233 in the section view from other perspectives, which is electrically connected, so that all the conductive coil layers are electrically connected to each other.

The second dielectric layer 28 forms on the second surface 252 of the patterned conductive circuit layer 25, and covers the patterned conductive circuit layer 25. In this embodiment, the material of the first dielectric layer 22 and the second dielectric layer 28 could be the high filler content dielectric material, such as the molding compound, which takes the Novolac-based resin, epoxy-based resin or silicone-based resin as the main substrate, occupies about 8 wt. %~12 wt. % of the overall proportion of the molding compound, and mixes with the filling agent about 70 wt. %~90 wt. % of the overall proportion. In which, the filling agent could include the silicon dioxide and the aluminum oxide, to realize the effect of increasing the mechanical strength, reducing the linear thermal expansion coefficient, increasing the heat transfer, increasing the water resistance and reducing the excessive glue.

The embedded electrical component 26 is disposed in the second dielectric layer 28, and electrically connected to the second surface 252 of the patterned conductive circuit layer 25. In which, the embedded electrical component 26 is electrically connected to the patterned conductive circuit layer 25 as the electrical pad. Moreover, the embedded electrical component 26 is a hall sensing component (or called Hall sensor), which could be the semiconductor package component or the chip and the die, no restriction thereof. However, if the embedded electrical component 26 uses the chip or the die, it could make the integrated driving module 20 thinner and smaller.

The conductive component 27 is disposed in the second dielectric layer 28, and one end of the conductive component 27 is electrically connected to the second surface 252 of the patterned conductive circuit layer 25, while the other end of the conductive component 27 is exposed to the surface of the second dielectric layer 28. In which, the conductive component 27 exposed to the second dielectric layer 28 is used as the electrical pad, to electrically connect with the external component through the conductive bump, the soldering tin or the conductive adhesive.

In addition, the integrated driving module 20 could include a conductive bonding layer 29, which is formed on the surface of the exposed patterned conductive layer 25 and the conductive component 27. The conductive bonding layer 29 could be the single layer structure, or the multilayer complex structure, to strengthen the joint effect. The conductive bonding layer 29 could also be called as the under bump metallurgy (UBM), whose material includes the titanium, aluminum, copper, nickel, palladium, gold or their alloys, no restriction thereof.

Figure 3:
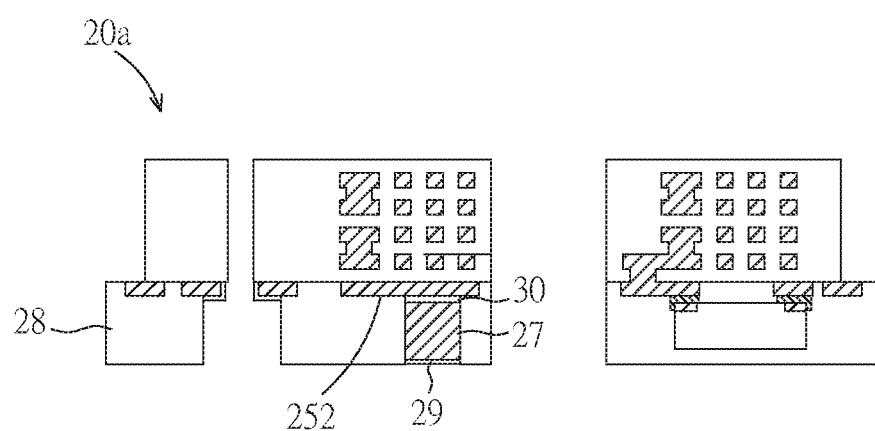
FIG. 3 is a schematic cross-sectional view showing another embodiment of the integrated drive module with the energy conversion function according to the preferred embodiment of the present invention.

Please refer to FIG. 3 then, an integrated driving module with energy conversion function according to another preferred embodiments of the present invention is showing. In this embodiment, the difference of the integrated driving module 20a and the integrated driving module 20 is that, the integrated driving module 20a includes a conductive fixing layer 30. The conductive fixing layer 30 is disposed between the conductive component 27 and the second surface 252 of the patterned conductive circuit layer 25. The conductive fixing layer 30 could be the component with fixing ability such as the conductive adhesive, to combine with the conductive component 27 and electrically connect to the patterned conductive circuit layer 25.

And then, please refer to FIG. 4A to FIG. 4J, to illustrate the manufacturing method of the integrated driving module with energy conversion function according to the preferred embodiment of the present invention.

Figure 4A:
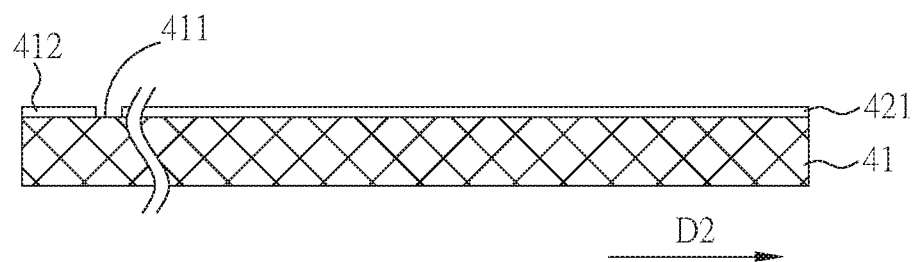
FIG. 4A to FIG. 4J are manufacturing flow charts showing a method of manufacturing the integrated driving module with the energy conversion function according to the preferred embodiment of the present invention.

As shown in FIG. 4A, step S01 is to provide a carrier board 41. The material of carrier board 41 could be metal, resin or glass. In this embodiment, a surface 411 of the carrier board 41 has at least one marker 412, which is used as the alignment marker in the processing. Moreover, the present invention adopts the panel type processing; in which, the size of carrier board 41 of the present invention along D2 direction could be plural times of single wafer diameter; or, the area of carrier board 41 could be plural times of single wafer area. Accordingly, the large-size carrier board 41 of the present invention could process all the dies cut from a plurality of wafers, and thus efficiently save the manufacturing time.

Next, step S02 is to form a first sub-dielectric layer 421 on the surface 411 of the carrier board 41. In this embodiment, the first sub-dielectric layer 421 could be formed through the molding technology or the compression molding technology. Taking the following simple example for illustration, firstly, provide a molding compound, which could be Novolac-based resin, epoxy-based resin, silicone-based resin or other proper molding compounds; next, heat the molding compound to the fluid status; then, inject the molding compound in fluid status to cover the carrier board 41, and solidify to form the first sub-dielectric layer 421. The above forming method of first sub-dielectric layer 421 is for example only, not restriction.

Figure 4B:
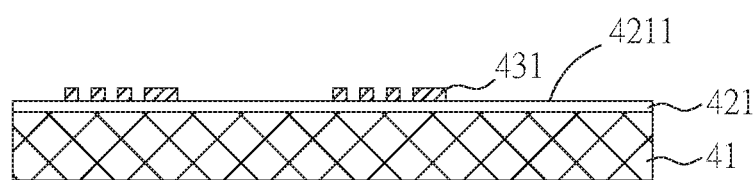

Then, as shown in FIG. 4B, step S03 is to forms a first conductive coil layer 431 on a surface 4211 of the first sub-dielectric layer 421. In this embodiment, the first conductive coil layer 431 could be formed by performing the exposure and development process with additional light resistance layer (not shown in the figure), and then performing the electroplating process.

Figure 4C:
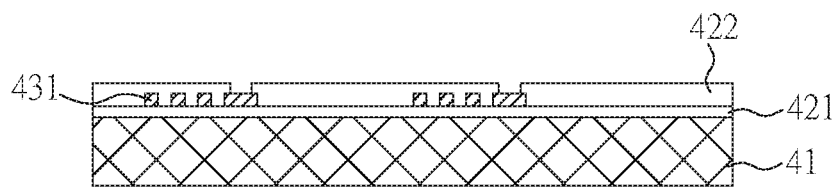

Then, as FIG. 4C, similar to step S02, step S04 is to form a second sub-dielectric layer 422 to cover the first conductive coil layer 431, and exposes part of the first conductive coil layer 431. In this embodiment, the exposure of the first conductive coil layer 431 could be realized after the laser drilling to the second sub-dielectric layer 422.

Figure 4D:
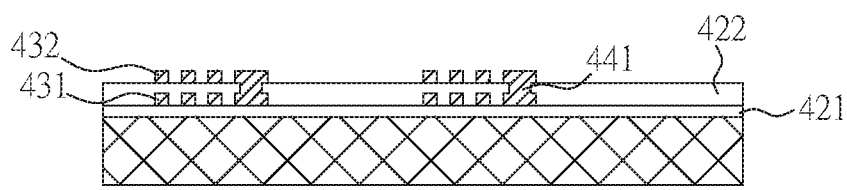

Then, as shown in FIG. 4D, similar to step S03, step S05 is to form a first conductive connecting component 441 on the exposed first conductive coil layer 431.

Then, similar to step S03, step S06 is to form a second conductive coil layer 432 on the second sub-dielectric layer 422 and the first conductive connecting component 441.

Figure 4E:
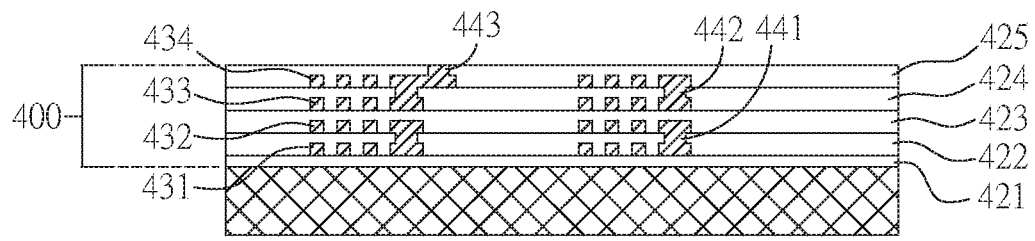

Then, as shown in FIG. 4E, similar to step S02, step S07 is to form a third sub-dielectric layer 423, to cover the second sub-dielectric layer 422 and the second conductive coil layer 432.

Similar to step S03, step S08 is to form a third conductive coil layer 433 on the third sub-dielectric layer 423.

Similar to step S02, step S09 is to form a fourth sub-dielectric layer 424 on the third conductive coil layer 433, and exposes part of the third conductive coil layer 433. In this embodiment, the exposure of third conductive coil layer 433 could be realized after the laser drilling to the fourth sub-dielectric layer 424.

Similar to step S03, step S10 is to form a second conductive connecting component 442 on the exposed third conductive coil layer 433.

Similar to step S03, step S11 is to form a fourth conductive coil layer 434 on the fourth sub-dielectric layer 424 and the second conductive connecting component 442.

Similar to step S02, step S12 is to form a fifth sub-dielectric layer 425 on the fourth conductive coil layer 434, and exposes part of the fourth conductive coil layer 434. In this embodiment, the exposure of fourth conductive coil layer 434 could be realized after the laser drilling to the fifth sub-dielectric layer 425.

Similar to step S03, step S13 is to form a third conductive connecting component 443 on the exposed fourth conductive coil layer 434.

The above-mentioned first sub-dielectric layer 421, the second sub-dielectric layer 422, the third sub-dielectric layer 423, the fourth sub-dielectric layer 424, the fifth sub-dielectric layer 425, the first conductive coil layer 431, the second conductive coil layer 432, the third conductive coil layer 433, the fourth conductive coil layer 434, the first conductive connecting component 441, the second conductive connecting component 442 and the third conductive connecting component 443 consists of an integrated electromagnetic induction component layer 400.

In particular, in other embodiments, step S07 may, after forming the third sub-dielectric layer 423, expose part of the second conductive coil layer 432 by laser drilling to the third sub-dielectric layer; and another conductive connecting component (not shown in the figure) is then formed on the exposed second conductive coil layer 432, to electrically connect the second conductive coil layer 432 and the third conductive coil layer 433.

Besides, in other embodiments, the above sub-dielectric layer, conductive coil layer and conductive connecting component could increase or decrease depending on the product demand, and the number of layers and connection relationship are not defined here.

Figure 4F:
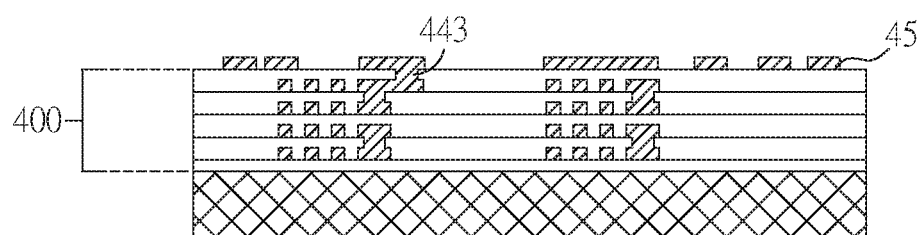

Then, as shown in FIG. 4F, step S14 is to form a patterned conductive circuit layer 45 on the integrated electromagnetic induction component layer 400, and electrically connects to third conductive connecting component 443.

Figure 4G:
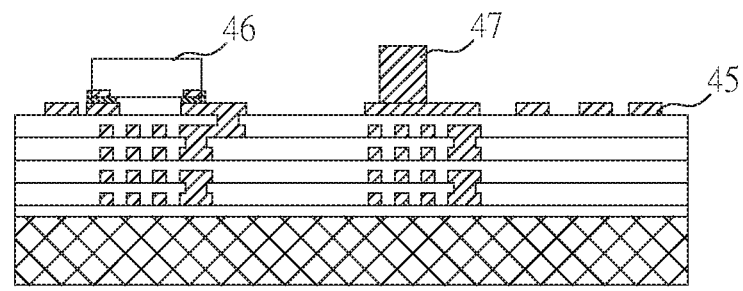

Then, as shown in FIG. 4G, step S15 is to set an embedded electrical component 46 on the patterned conductive circuit layer 45. In this embodiment, the embedded electrical component 46 could be electrically connected with the patterned conductive circuit layer 45 through the surface-mount technology by soldering tin, or electrically connected with the patterned conductive circuit layer 45 by the conductive bump or the conductive adhesive.

Then, as shown in FIG. 4G, step S16 is to set a conductive component 47 on the patterned conductive circuit layer 45. In this embodiment, the conductive component 47 could be formed by performing the exposure and development process with additional light resistance layer (not shown in the figure), and then performing the electroplating process. While in other embodiments, the conductive component 47 could be pre-formed, and then fixed on the patterned conductive circuit layer 45 through the conductive fixing layer 30 such as conductive adhesive, to form the pattern as shown in FIG. 3.

Figure 4H:
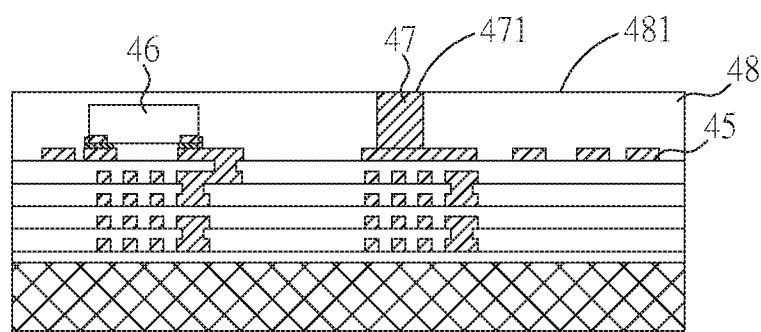

Then, as shown in FIG. 4H, step S17 is to form a second dielectric layer 48, and to cover the patterned conductive circuit layer 45, the embedded electrical component 46 and the conductive component 47. And then, it could selectively grind the surface 481 on the second dielectric layer 48, to expose an end face 471 of the conductive component 47.

Figure 4I:
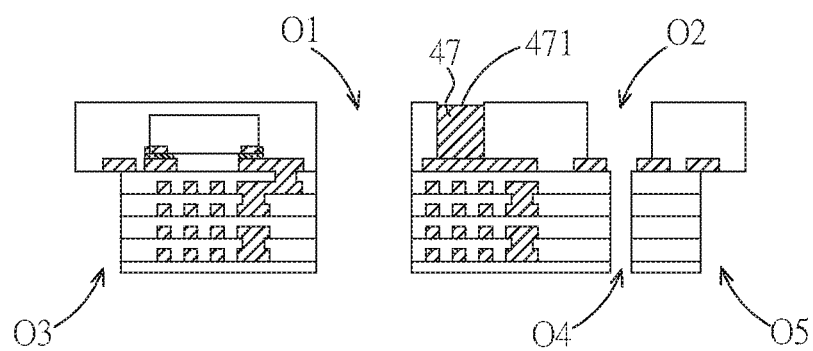

Then, as shown in FIG. 4I, step S18 is to remove the carrier board 41, and to form the opening O1~O5, so as to form a three-dimensional structure. Herein, it could selectively corrode the end face 471 of conductive component 47, to make it not in the same plane with the surface 481 of second dielectric layer 48, for the convenience of follow-up processing.

Figure 4J:
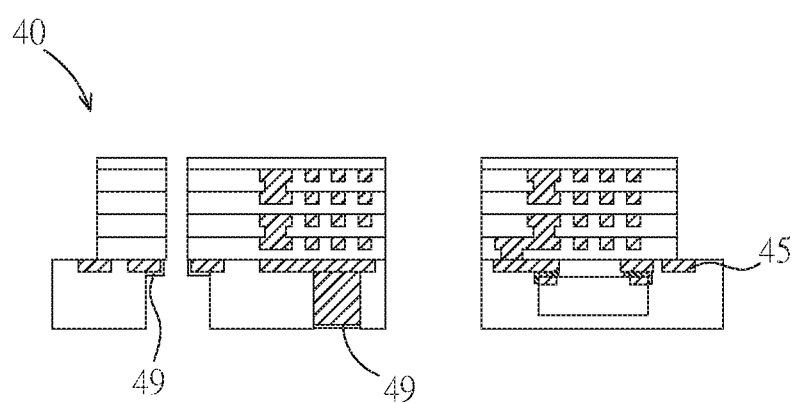

Then, as shown in FIG. 4J, step S19 is to form the conductive bonding layer 49 on the exposed patterned conductive layer 45 and the end face 471 of conductive component 47. And then, turn the finished product formed in step S19 to form a plurality of integrated driving modules. Finally, cut to separate and form individual integrated driving module 40.

In particular, each of the above steps may contain the marker 412 of the carrier board 41 for marker alignment before performing. In this way, the product precision of integrated driving module can be improved.

As mentioned above, according to the present invention, the integrated driving module with energy conversion function and its manufacturing method, are mostly through the semiconductor processing, including the integrated electromagnetic induction component, the patterned conductive circuit layer and the conductive component, etc. According to this, the manual assembly process can be reduced, the yield can be increased, and the driving module can be formed as a whole, thereby reducing the overall size and thickness. Moreover, through the marker on the carrier board, the integrated driving module produced by the manufacturing method of the present invention can be made with higher product precision, and the driving module can be formed as a whole, thereby reducing the overall size and thickness. In addition, due to the improvement of manufacturing process precision, the electromagnetic induction effect of integrated electromagnetic induction component layer is also improved.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:

1. A manufacturing method of an integrated driving module with energy conversion function, comprising:
   providing a carrier board;
   forming an integrated electromagnetic induction component layer having a first dielectric layer, a plurality of conductive coil layers and a plurality of conductive connecting components on a surface of the carrier board;
   forming a patterned conductive circuit layer on the integrated electromagnetic induction component layer, and electrically connecting to each other through the conductive connecting components;
   disposing an embedded electrical component on the patterned conductive circuit layer;
   disposing a conductive component on the patterned conductive circuit layer;
   forming a second dielectric layer to cover the embedded electrical component and the conductive component; and
   removing the carrier board to form a plurality of integrated driving modules.

2. The manufacturing method according to claim 1, wherein the step for forming the integrated electromagnetic induction component layer further comprising:
   forming a first sub-dielectric layer on the surface of the carrier board;
   forming a first conductive coil layer on a surface of the first sub-dielectric layer;
   forming a second sub-dielectric layer to cover the first conductive coil layer and the first sub-dielectric layer, and to expose a part of the first conductive coil layer;
   forming a first conductive connecting component on the exposed first conductive coil layer;
   forming a second conductive coil layer on the second sub-dielectric layer and the first conductive connecting component;
   forming a third sub-dielectric layer to cover the second sub-dielectric layer and the second conductive coil layer; and
   selectively repeating the above steps.

3. The manufacturing method according to claim 1, further comprises selectively grinding an upper surface of the second dielectric layer, to expose an end face of the conductive component.

4. The manufacturing method according to claim 1, further comprises forming at least one opening, to expose a part of the patterned conductive circuit layer.

5. The manufacturing method according to claim 1, further comprises cutting the integrated driving module, to form individual integrated driving module.

6. The manufacturing method according to claim 1, wherein the carrier board has at least one alignment marker, and before implementing each processing step further comprises aligning according to the alignment marker.

* * * * *